United States Patent
Elkind

Patent Number: 5,110,410
Date of Patent: May 5, 1992

[54] ZINC SULFIDE PLANARIZATION

[75] Inventor: Jerry L. Elkind, Dallas, Tex.

[73] Assignee: Texas Instruments Incorporated, Dallas, Tex.

[21] Appl. No.: 566,746

[22] Filed: Aug. 13, 1990

[51] Int. Cl.⁵ ............................................. H01L 21/00
[52] U.S. Cl. .................................. 156/643; 156/646; 156/656; 156/659.1; 156/652; 437/187; 437/228; 437/235
[58] Field of Search ............ 156/656, 646, 643, 659.1, 156/652; 437/185, 187, 228, 235; 204/192.35

[56] References Cited

U.S. PATENT DOCUMENTS

| | | | |
|---|---|---|---|
| 4,377,904 | 3/1983 | Chapman et al. | 437/235 X |
| 4,734,152 | 3/1988 | Geis et al. | 456/646 |
| 4,847,214 | 7/1989 | Robb et al. | 437/67 |
| 4,855,160 | 8/1989 | Luttmer et al. | 437/235 X |
| 4,910,164 | 3/1990 | Shichijo | 437/99 X |

Primary Examiner—David A. Simmons
Assistant Examiner—Thi Dang
Attorney, Agent, or Firm—Melvin Sharp; James T. Comfort; N. Rhys Merrett

[57] ABSTRACT

A procedure for planarizing a group II–VI composition which includes a resist and etch-back procedure wherein a thick resist coating relative to the degree of non-planarity is spun over a non-planar group II–VI layer to provide a planar resist surface. The resist is then etched back to the group II–VI layer with etching of both the resist and the group II–VI layer then continuing simultaneously and at substantially the same etch rate until all of the resist has been removed. The etching takes place in a chamber having a parallel plate RF plasma etcher using a dry etchant which uses the RF plasma. The etchant is a hydrogen and oxygen combination at low pressure which is activated by the RF excitation. An inert gas, preferably argon, and methane can optionally be added to the gas flow. The flow rate at each inlet is continuously adjustable. The flow of gas into the chamber continues while the chamber is also being pumped simultaneously to maintain the desired pressure within the chamber. This produces hydrogen radicals and oxygen radicals and this mixture etches both the group II–VI insulator and the photoresist. By controlling the etch conditions, the group II–VI insulator and the photoresist are etched at the same rate.

22 Claims, 1 Drawing Sheet

ZINC SULFIDE PLANARIZATION

BACKGROUND OF THE INVENTION

1. Field of the Invention

This invention relates to a process for planarizing group II-VI insulators and to an etching procedure and etchant therefor.

2. Brief Description of the Prior Art

In multilayer semiconductor devices, excess topology or non-planarity is often introduced during fabrication by underlying partial structures, particularly levels of metal, such as metal lines or buses. This causes insulator thereover to generally conform to the topology therebelow and introduce the same non-planarity therein. A result is that stress is introduced into the device and crevices resulting from the non-planarity collect unwanted particles, both of which are causes for device degradation, such as, for example, short circuits and a concomitant reduction in ultimate yield.

In the prior art silicon technology, non-planarity problems are alleviated by a procedure known as resist and etch-back wherein a resist or other conformal material is spun over the non-planar layer having a thickness much greater than the amount of non-planarity with a resulting planar or flat resist surface, regardless of the topology thereunder. The resist is than etched back with an etchant which etches the non-planar layer thereunder at the same etch rate as the resist until all of the resist has been removed and the former non-planar layer thereunder has been planarized.

No equivalent procedure is known for use in conjunction with group II-VI semiconductor compositions, apparently because the chemistry involved is entirely different from that involving silicon technology and the procedures used in conjunction with silicon technology are not transferable to group II-VI technology. It is therefore apparent that an entirely new procedure is required for planarization of group II-VI compositions.

SUMMARY OF THE INVENTION

In accordance with the present invention, a resist and etch-back procedure for use in conjunction with group II-VI insulators and particularly zinc sulfide (ZnS) as well as an etchant for performing the etch-back is provided.

Briefly, there is provided a resist and etch-back procedure wherein a thick resist coating relative to the degree of non-planarity is spun over a non-planar group II-VI layer to provide a planar resist surface. The resist is then etched back to the group II-VI layer with etching of both the resist and the group II-VI layer then continuing simultaneously and at substantially the same etch rate until all of the resist has been removed.

The etching takes place, preferably in a standard advanced vacuum processor which is a chamber having a parallel plate RF plasma etcher using a dry etchant which uses the RF plasma. The voltage across the plates is from about 100 to about 700 volts AC and preferably 300 volts, the RF power if from about 20 to about 300 watts and preferably 50 watts and there is a DC bias on the relatively negative plate of from about 30 to about 400 volts DC and preferably 100 volts. The frequency is preferably 13.56 MHz. which is set by the FCC. The pressure in the chamber is from about 0.3 to about 1.0 Torr and preferably 0.5 Torr. and the temperature is from about 30° to about 150° C. and preferably 90° C.

The etchant is a hydrogen and oxygen combination at low pressure which is activated by the RF excitation. The system includes a plurality of inlets, one for oxygen and one for hydrogen and optional gas inlets, one for an inert gas, preferably argon, and one for methane. The flow rate at each inlet is continuously adjustable. The amount of oxygen used is generally less than the amount of hydrogen. The amount of gas flow is, in the case of a 4 inch diameter wafer, for oxygen, from about 10 to about 50 SCCM, for hydrogen from about 50 to about 500 SCCM, for argon, if used, from about 200 to about 1000 SCCM and for methane, if used, from about 10 to about 100 SCCM. The flow of gas into the chamber continues while the chamber is also being pumped simultaneously to maintain the desired pressure within the chamber. These flow rates would change in the case of larger or smaller diameter wafers or increased or decreased wafer batch size. This produces hydrogen radicals and oxygen radicals and this mixture etches both the group II-VI insulator and the photoresist. By controlling the etch conditions primarily by adjusting gas flow rates relative to each other, the group II-VI insulator and the photoresist are etched at the same rate.

DESCRIPTION OF THE PREFERRED EMBODIMENT

Figure 1:
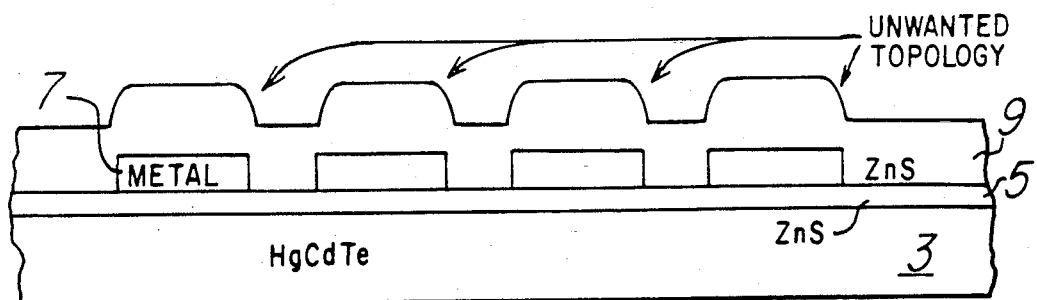
FIG. 1 is a cross-sectional diagram of a group II-VI device being fabricated with a non-planar ZnS insulating layer over metal conductors.

Referring first to FIG. 1, there is shown a portion of a typical group II-VI wafer 1 under fabrication which includes a substrate 3 of HgCdTe, a layer ZnS 5 and metalization 7 over the layer 5. A layer of ZnS 9 is formed over the metalization 7 and over the layer 5 in the regions were there is no metalization. Since the ZnS layer 9 substantially tracks the topology therebelow, it can be seen that the surface of the layer 9 is non-planar.

Figure 2:
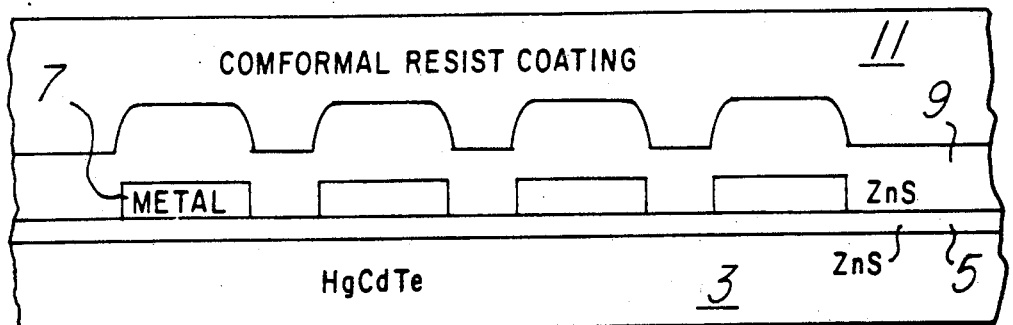
FIG. 2 is a diagram as in FIG. 1 with a conformal resist coating over the ZnS layer.
Figure 3:
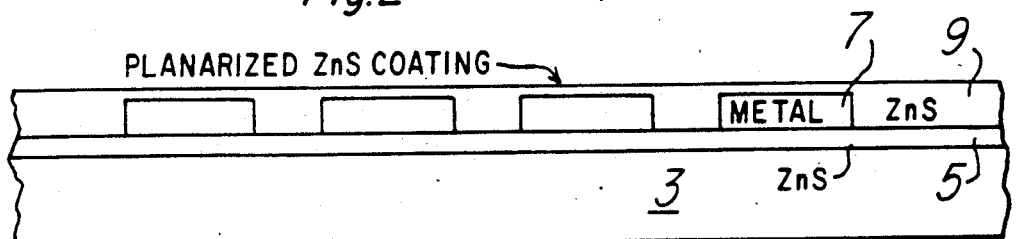
FIG. 3 is a diagram as in FIG. 2 with the resist and ZnS etched back to provide a planar layer of ZnS.

In order to eliminate this non-planarity, as shown in FIG. 2, a layer of resist 11 is spun over the ZnS layer 9 in standard whereby the top surface of the resist is planar. The resist 11 is then etched back until the non-planarity is removed from the ZnS layer 9 whereupon the etching continues until all of the resist is removed as shown in FIG. 3. This is accomplished by using an etchant which etches the resist at substantially the same rate that it etches the ZnS layer 9 to provide a planarized ZnS layer.

Figure 4:
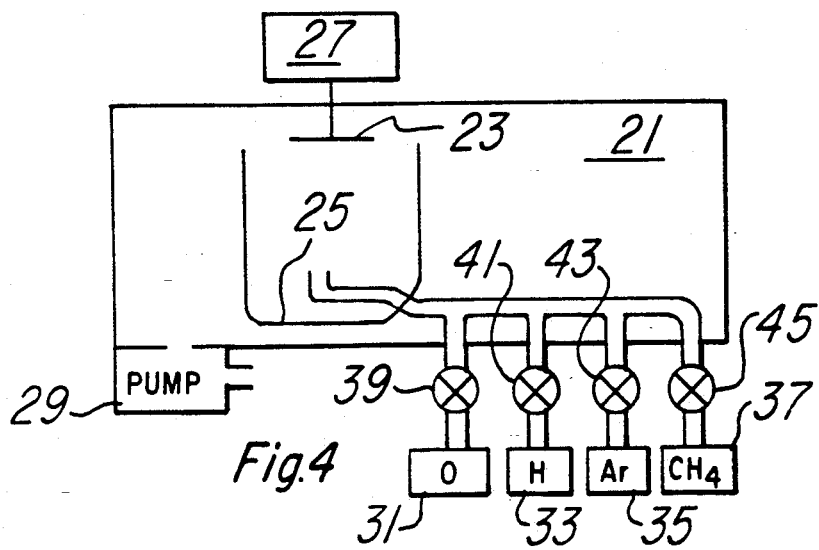
FIG. 4 is a diagram of a typical etching chamber which would be used in conjunction with the present invention.

The etching takes place in a standard advanced vacuum processor as schematically depicted in FIG. 4 which is a chamber 21 having a parallel plate RF plasma etcher with negative plate 23 and grounded positive plate 25. The voltage across the plates 23 and 25 is from 200 volts AC, the RF power is 100 watts and there is a DC bias on the relatively negative plate 23 of 100 volts DC. The frequency of the voltage is 13.56 MHz. The parameters producing the plasma are controllable by a controller 27. The pressure in the chamber is 0.5 Torr.

and is evacuated by a pump 29. The temperature in the chamber is 90° C.

The etchant is a dry etchant which is a hydrogen and oxygen combination at low pressure which is activated by the RF excitation. The system includes a plurality of inlets, one for oxygen 31 and one for hydrogen 33 and optional gas inlets, one for argon 35, and one for methane 37. The flow rate at each inlet is continuously adjustable by valves 39, 41, 43 and 45 either manually or by a controller, not shown. The amount of oxygen used is generally less than the amount of hydrogen. The amount of gas flow is, in the case of a 4 inch diameter wafer, for oxygen, 30 SCCM, for hydrogen 150 SCCM, for argon, if used, 500 SCCM and for methane, if used, 30 SCCM. The chamber is also being simultaneously evacuated by the pump 29 to maintain the 0.5 Torr pressure within the chamber. These flow rates would change in the case of larger or smaller diameter wafers or increased or decreased wafer batch size. This produces hydrogen radicals and oxygen radicals and this mixture etches both the group II-VI composition and the photoresist. By controlling the etch conditions by adjusting the gas flow rates of the etchant gases at inlets 31, 33, 35 and 37 via valves 39, 41, 43 and 45 respectively, the group II-VI compound and the photoresist are etched at the same rate.

It can be seen that there has been provided an etch procedure as well as an etchant whereby planar layers of group II-VI materials can be produced.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of planarizing a group II-VI insulating layer comprising the steps of:
   (a) providing a device having a non-planar group II-VI insulating layer as an outer surface thereof;
   (b) forming a layer of etchable material over said insulating layer having a planar outer surface; and
   (c) etching said etchable layer to expose said insulating layer and then etching both said etchable layer and said insulating layer at substantially the same etch rate until said etchable material is substantially all etched away to provide a planar group II-VI insulating layer.

2. The method of claim 1 wherein said insulating layer is ZnS.

3. The method of claim 1 wherein said layer of etchable material is a resist.

4. The method of claim 2 wherein said layer of etchable material is a resist.

5. A method of planarizing a group II-VI insulating layer comprising the steps of:
   (a) providing a device having a non-planar group II-VI insulating layer as an outer surface thereof;
   (b) forming a layer of etchable material over said insulating layer having a planar outer surface; and
   (c) etching said etchable layer to expose said insulating layer and then etching both said etchable layer and said insulating layer at substantially the same etch rate until said etchable material is substantially all etched away to provide a planar group II-VI insulating layer;
   wherein said step of etching comprises the steps of:
   (d) providing a vacuum chamber having a pair of spaced electrically conductive plates therein;
   (e) placing said device of step (b) in said vacuum chamber;
   (f) decreasing the pressure in said chamber to a pressure in the range of about 0.3 to about 1.0 Torr. and providing a temperature in said chamber of from about 30° to about 150° C.;
   (g) applying a voltage across said plates of from about 100 to about 700 volts AC with RF power of from about 20 to about 300 watts at a frequency of about 13.56 KHz; and
   (h) entering oxygen and hydrogen into said chamber at a flow rate for said oxygen of from about 10 to about 50 SCCM and for said hydrogen of from about 50 to about 500 SCCM while maintaining said pressure in said chamber.

6. The method of claim 5 wherein said insulating layer is ZnS.

7. The method of claim 5 wherein said layer of etchable material is a resist.

8. The method of claim 6 wherein said layer of etchable material is a resist.

9. The method of claim 5 wherein said pressure is 0.5 Torr, said temperature is 90° C., said oxygen flow rate is 30 SCCM and said hydrogen flow rate is 250 SCCM.

10. The method of claim 5 further including in step (h) entering an inert gas into said chamber along with said oxygen and hydrogen.

11. The method of claim 10 further including the step of adding methane along with said inert gas.

12. The method of claim 5 further including in step (h) entering methane into said chamber along with said oxygen and hydrogen.

13. The method of claim 10 wherein said inert gas is argon.

14. The method of claim 11 wherein said inert gas is argon.

15. The method of claim 14 wherein the flow rate of said argon is from about 200 to about 1000 SCCM and the flow rate of said methane is from about 10 to about 100 SCCM.

16. A method of etching a non-planar group II-VI composition having a conformal resist coating thereon which comprises the steps of:
   (a) providing a vacuum chamber having a pair of spaced electrically conductive plates therein;
   (b) placing said composition having a non-planar surface of a group II-VI composition with conformal resist coating thereon in said vacuum chamber;
   (c) decreasing the pressure in said chamber to a pressure in the range of about 0.3 to about 1.0 Torr and providing a temperature in said chamber of from about 30° to about 150° C.;
   (d) applying a voltage across said plates of from about 100 to about 700 volts AC with RF power of from about 20 to about 300 watts at a frequency of about 13.56 KHz; and
   (e) entering oxygen and hydrogen into said chamber at a flow rate for said oxygen of from about 10 to about 50 SCCM and for said hydrogen of from about 50 to about 500 SCCM while maintaining said pressure in said chamber to etch said composition and resist.

17. The method of claim 16 wherein said pressure is 0.5 Torr, said temperature is 90° C., said oxygen flow rate is 30 SCCM and said hydrogen flow rate is 250 SCCM.

18. The method of claim 16 further including in step (f) entering an inert gas into said chamber along with said oxygen and hydrogen.

19. The method of claim 18 further including in step (f) entering methane gas into said chamber along with said oxygen and hydrogen.

20. The method of claim 18 further including entering methane into said chamber along with said inert gas.

21. The method of claim 20 wherein said inert gas is argon.

22. The method of claim 21 wherein the flow rate of said argon is from about 200 to about 1000 SCCM and the flow rate of said methane is from about 10 to about 100 SCCM.

* * * * *